(12) United States Patent
Ma et al.

(10) Patent No.: US 10,553,448 B2
(45) Date of Patent: Feb. 4, 2020

(54) TECHNIQUES FOR PROCESSING A POLYCRYSTALLINE LAYER USING AN ANGLED ION BEAM

(71) Applicant: Varian Semiconductor Equipment Associates, Inc., Gloucester, MA (US)

(72) Inventors: Tristan Y. Ma, Lexington, MA (US); Morgan Evans, Manchester, MA (US); Kevin Anglin, Somerville, MA (US); Robert J. Masci, Atkinson, NH (US); John Hautala, Beverly, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 347 days.

(21) Appl. No.: 15/339,517

(22) Filed: Oct. 31, 2016

(65) Prior Publication Data

US 2018/0122650 A1 May 3, 2018

(51) Int. Cl.
| | |
|---|---|
| *H01L 21/3213* | (2006.01) |
| *H01L 21/321* | (2006.01) |
| *B24B 37/20* | (2012.01) |
| *C23F 4/00* | (2006.01) |
| *H01J 37/32* | (2006.01) |

(52) U.S. Cl.
CPC ........ *H01L 21/32131* (2013.01); *B24B 37/20* (2013.01); *C23F 4/00* (2013.01); *H01J 37/32422* (2013.01); *H01J 37/32623* (2013.01); *H01J 37/32633* (2013.01); *H01L 21/32115* (2013.01)

(58) Field of Classification Search
CPC .................... H01L 21/32131; H01L 21/32115
See application file for complete search history.

(56) References Cited

U.S. PATENT DOCUMENTS

| | | | | |
|---|---|---|---|---|
| 5,990,478 | A * | 11/1999 | Liu .......................... | G01N 1/32 204/192.34 |
| 6,288,357 | B1 * | 9/2001 | Dyer ....................... | C03C 15/02 204/192.34 |
| 9,577,183 | B2 * | 2/2017 | Kim ......................... | H01L 43/12 |
| 2008/0176400 | A1 * | 7/2008 | Hachigo ................. | C30B 29/40 438/691 |
| 2014/0017817 | A1 * | 1/2014 | Godet ..................... | H01L 43/12 438/3 |

* cited by examiner

*Primary Examiner* — Jason Berman

(57) ABSTRACT

A method of processing a layer. The method may include providing the layer on a substrate, the substrate defining a substrate plane; directing an ion beam to an exposed surface of the layer in an ion exposure when the substrate is disposed in a first rotational position, the ion beam having a first ion trajectory, the first ion trajectory extending along a first direction, wherein the first ion trajectory forms a non-zero angle of incidence with respect to a perpendicular to the substrate plane; performing a rotation by rotating the substrate with respect to the ion beam about the perpendicular from the first rotational position to a second rotational position; and directing the ion beam to the exposed surface of the layer in an additional ion exposure along the first ion trajectory when the substrate is disposed in the second rotational position.

18 Claims, 6 Drawing Sheets

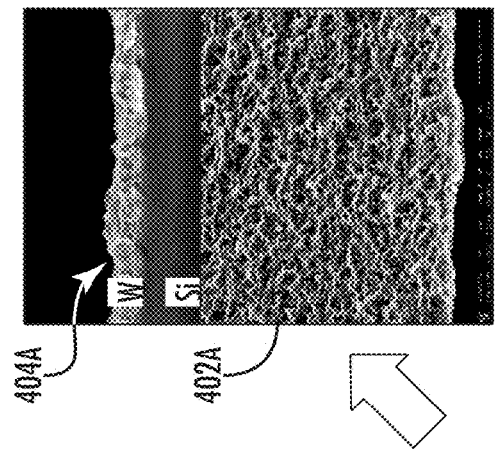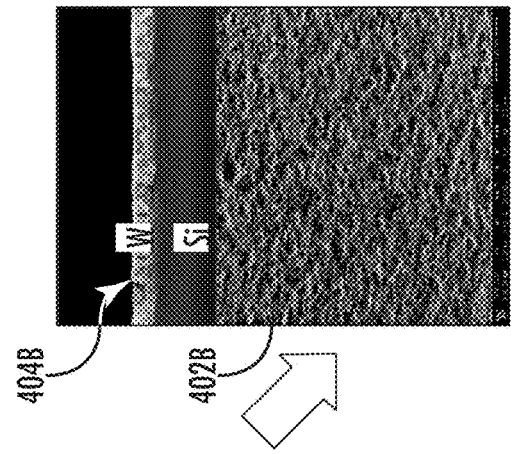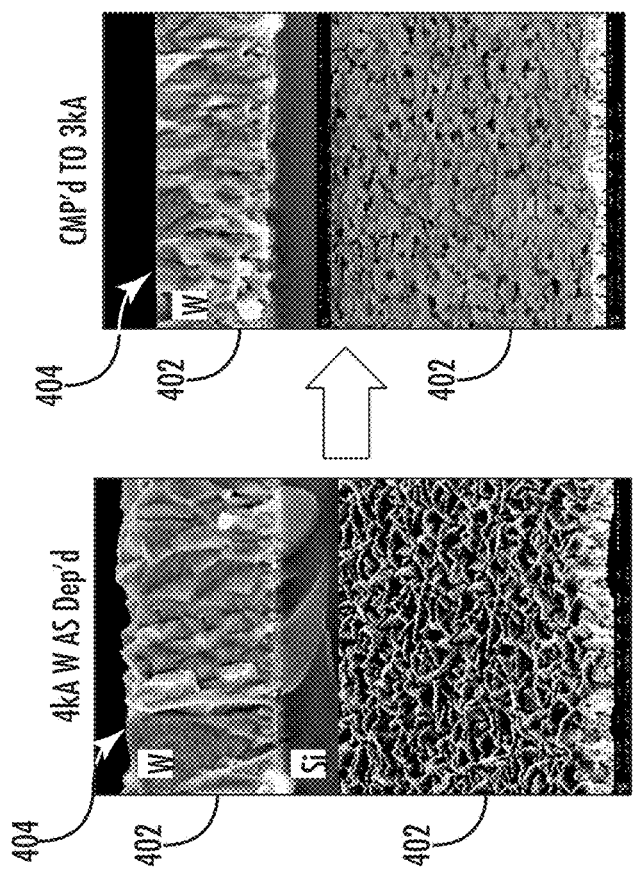

TECHNIQUES FOR PROCESSING A POLYCRYSTALLINE LAYER USING AN ANGLED ION BEAM

FIELD

The present embodiments relate to thin film processing techniques, and more particularly, to planarizing and smoothing polycrystalline layers.

BACKGROUND

Planarization of thin films is ubiquitously practiced in the manufacture of semiconductor devices such as integrated circuit devices. Commonly, chemical mechanical polishing (CMP) is performed after deposition of a thin film such as tungsten (W) in order to planarize and/or remove material of the thin film. For example, in replacement gate transistor technology the CMP may be used to create a tungsten replacement metal gate transistor, or may be used to leave columns of tungsten above the source and drain areas of transistors as contacts to current-carrying lines arranged in layers above the transistor.

CMP has several drawbacks including the inability to provide flatness across a wafer (substrate), dishing, erosion, as well as chemical selectivity to underlying areas.

In addition to CMP approaches, techniques have been developed to remove thin film material and planarize the layer using ions. Known processing techniques using ions may, while removing polycrystalline material in particular, generate unwanted levels of surface roughness of the film being treated. This roughness may be a result of the significantly different sputter yields for different facets of a crystal, such as tungsten metal. The resultant polycrystalline layer roughness may generate undesirable IC processing yield, and may limit thin film thickness measurements using standard optical metrology methods such as Ellipsometry, Reflectometry and Scatterometry.

With respect to these and other considerations the present disclosure is provided.

BRIEF SUMMARY

A method of processing a layer may include providing the layer on a substrate, the substrate defining a substrate plane. The method may further include directing an ion beam to an exposed surface of the layer in an ion exposure when the substrate is disposed in a first rotational position, where the ion beam has a first ion trajectory extending along a first direction, wherein the first ion trajectory forms a non-zero angle of incidence with respect to a perpendicular to the substrate plane. The method may also include performing a rotation by rotating the substrate with respect to the ion beam about the perpendicular from the first rotational position to a second rotational position; and directing the ion beam to the exposed surface of the layer in an additional ion exposure along the first ion trajectory when the substrate is disposed in the second rotational position.

In another embodiment, a method of processing a layer disposed on a substrate, may include directing an ion beam to an exposed surface of the layer in a first ion exposure when the substrate is disposed in a first rotational position, the ion beam having a first ion trajectory forming a non-zero angle of incidence with respect to a perpendicular to a substrate plane. The method may further include scanning, during the first ion exposure, the substrate in a first scan along a scan direction, the scan direction lying in the substrate plane. The method may also include performing a rotation by rotating the substrate with respect to the ion beam about the perpendicular from the first rotational position to a second rotational position. The method may further include directing the ion beam to the exposed surface of the layer in an additional ion exposure along the first ion trajectory, when the substrate is disposed in the second rotational position; and scanning, during the additional ion exposure, the substrate in a second scan along the scan direction.

In another embodiment, a method of processing a metal layer may include providing a substrate comprising the layer and a buried feature, wherein the metal layer is disposed over the buried feature. The method may also include directing an ion beam to an exposed surface of the layer in a first ion exposure when the substrate is disposed in a first rotational position, the ion beam having a first ion trajectory forming a non-zero angle of incidence with respect to a perpendicular to the substrate plane. The method may also include scanning, during the first ion exposure, the substrate in a first scan along a scan direction, the scan direction lying in the substrate plane. The method may additionally include performing a rotation by rotating the substrate with respect to the ion beam about the perpendicular from the first rotational position to a second rotational position. The method may include directing the ion beam to the exposed surface of the layer in a second ion exposure along the first ion trajectory, when the substrate is disposed in the second rotational position; and scanning, during the second ion exposure, the substrate in a second scan along the scan direction.

BRIEF DESCRIPTION OF THE DRAWINGS

FIG. 4A to FIG. 4B show initial operations in a process sequence for etching a metal layer in accordance with an embodiment of the disclosure;

FIG. 4C shows the results of directing a perpendicular ion beam to the metal layer after the operation of FIG. 4B;

FIG. 4D shows the results of etching the metal layer of FIG. 4B using techniques of the present embodiments;

FIG. 7B is a graph providing exemplary data illustrating the current distribution for the combination of ion beams of FIG. 7A;

Figure 1A:
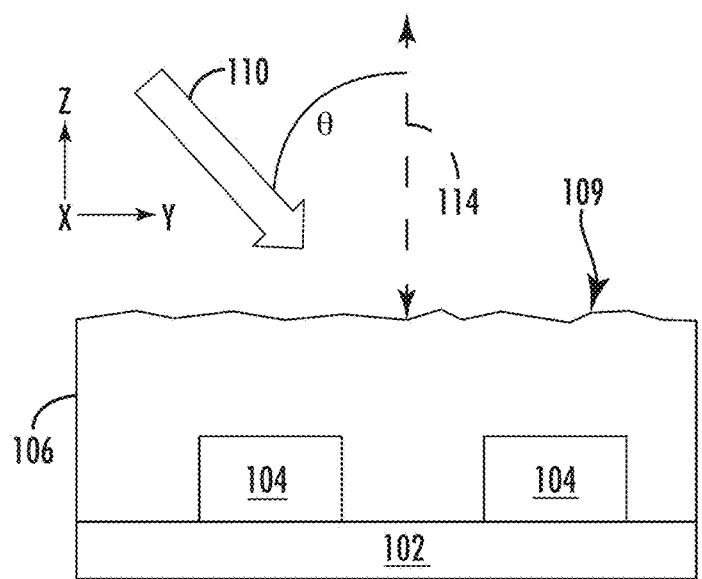
FIGS. 1A-1C depict side view of a substrate during various operations involved for processing of a polycrystalline layer, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques to process films and in particular polycrystalline thin layers. In particular, the present embodiments are related to techniques and apparatus for etching polycrystalline layers, where a polycrystalline layer may be a polycrystalline metal layer. Various embodiments involve processing polycrystalline layers to remove the crystalline material disposed on a substrate, as well as to planarize and smooth the surface of the substrate, including the polycrystalline layer.

Figure 1D:
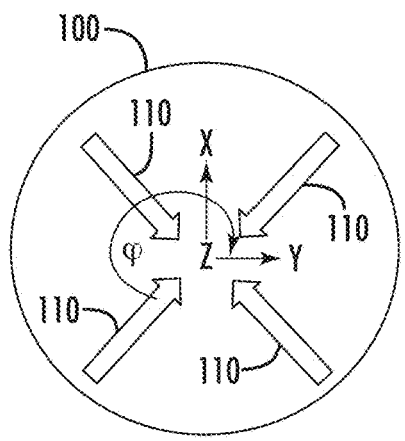
FIG. 1D depicts a top plan view of the operations of FIGS. 1A-1C.
Figure 1B:
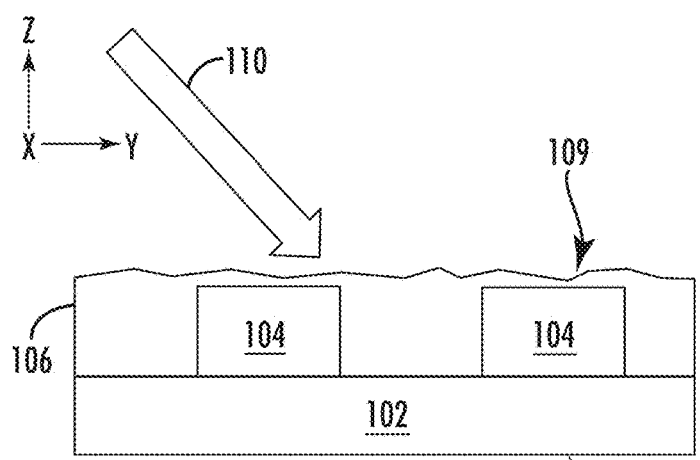
Figure 1E:
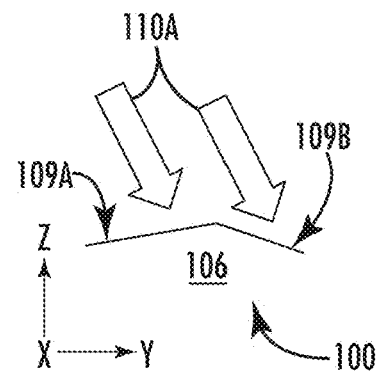
FIG. 1E and FIG. 1F depict details of two different ion exposures, in accordance with the present embodiments.
Figure 1C:
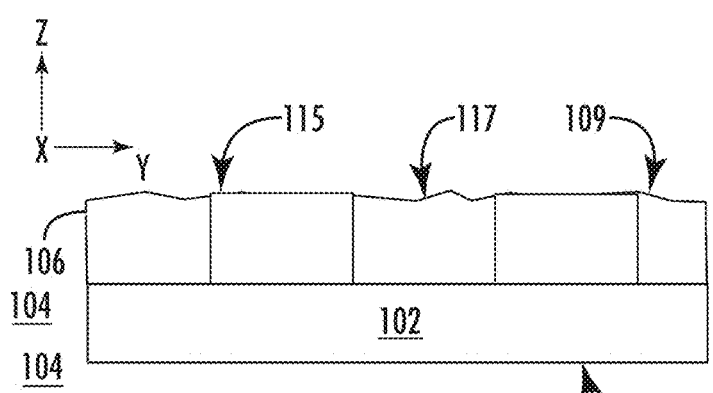

FIGS. 1A-1C depict side cross-sectional view of a substrate during various operations involved for processing of a polycrystalline layer, according to embodiments of the disclosure. FIG. 1D depicts a top plan view of the operations of FIGS. 1A-1C. The processing shown in FIGS. 1A-1C may result in planarization of an overlying polycrystalline layer, as well as any underlying structures, as known in the art.

Turning now to FIG. 1A there is shown a substrate 100 including a substrate base 102, where the substrate base 102 may represent any number of layers, including any number of structures within a layer. As shown in FIG. 1A, a substrate feature 104, shown as two features, is disposed on the substrate base 102, where the substrate feature 104 may be the same material or a different material from the material of substrate base 102. In one example, the substrate feature 104 may be an insulator, such as an oxide or nitride. In other examples, the substrate feature 104 may be a semiconductor material such as silicon, and in particular embodiments, polycrystalline silicon. The embodiments are not limited in this context.

As further shown in FIG. 1A, the substrate includes a layer 106, where the layer 106 exhibits a surface 109 having a given surface roughness, as shown. While not necessarily drawn to scale, in some embodiments, the layer 106 may exhibit an initial thickness along the Z-axis of 100 nm, 200 nm, 500 nm, or more, while the surface roughness of the layer 106 may be such where the thickness of the layer 106 varies by several nm, 10 nm, 20 nm, 50 nm, or more. The thickness variation in layer 106 may take place over a similar length scale along the X-axis or Y-axis, such as several nm, 10 nm, 20 nm, 50 nm. In various non-limiting embodiments, the layer 106 may be a polycrystalline material, such as a polycrystalline metal, and the roughness of the layer 106 may reflect the polycrystalline nature of the layer 106. For example, because polycrystalline materials include multiple crystallites the surface of the layer 106 may include the surfaces of many different crystal facets, where the crystal facets may reflect the crystallographic faces or planes of the metal material of layer 106. Depending upon the method and processing conditions for forming metal layer 106, the degree of surface roughness may vary.

As further shown in FIG. 1A, the polycrystalline layer is disposed over the substrate base 102 and over the substrate feature 104. In particular, while two substrate features are shown, the substrate 100 may include a plurality of substrate features, such as substrate feature 104, where the substrate 100 is to be processed in a manner to remove material of layer 106 from above the substrate feature 104. In one specific embodiment, the layer 106 may be tungsten, where the tungsten is deposited by a known blanket deposition process, over the substrate 100, including a plurality of substrate features 104. During device processing, a designed device structure may, for example, include metal plugs or lines to be formed from the layer 106. The structure of FIG. 1A, where the substrate feature 104 is initially arranged as a buried feature, may accordingly be processed to form a planarized substrate, where the substrate feature 104 is no longer a buried feature. After planarization, the material of layer 106 may be removed to form isolated structures, and where the final surface of layer 106, shown as surface 109, and the upper surface 115 of substrate feature 104 define a common surface, shown as surface 117 in FIG. 1C.

In order to generate a target structure, such as shown in FIG. 1C, according to the embodiment of FIG. 1A the ion beam 110 is directed to the substrate 100 to etch material of the layer 106. In some embodiments, the ion beam 110 may be inert gas ions, such argon, krypton, neon, and the like, while in other embodiments, the ion beam 110 may be reactive ions, or may be a mixture of reactive ions and inert gas ions. An advantage of using inert gas ions to etch the layer 106 is the avoidance of etch selectivity when ions are provided in a reactive chemistry, where a certain material, such as layer 106, is etched preferentially with respect to another material, such as substrate feature 104. Such preferential etching may result in dishing, pattern loading, or other known undesirable effects of planarization. In various embodiments the ion beam 110 may comprise an ion energy appropriate to generate sputter etching of the layer 106, such as an ion energy between 200 eV and 10 keV. The embodiments are not limited in this context.

According to various embodiments, the ion beam 110 may be directed to the exposed surface of the layer 106 along a first ion trajectory, as indicated by the left arrow in FIG. 1A, where the exposed surface is represented by a surface 109. The first ion trajectory may extend along a first direction, where the first ion trajectory forms a non-zero angle of incidence (θ) with respect to a perpendicular 114 to a substrate plane, defined as a plane parallel to the X-Y plane in the Cartesian coordinate system shown. As such, the ion beam 110 may sputter-etch material from the surface 109 of the layer 106. The sputter-etching may tend to reduce the overall thickness of the layer 106 so as to form the planarized structure of FIG. 1C. Additionally, and in accordance with embodiments of the disclosure, the surface roughness of layer 106 may be reduced from the initial surface roughness of FIG. 1A, to a lesser roughness, as suggested in FIG. 1B and FIG. 1C, or at least maintained within a tolerance level of surface roughness, as detailed below.

In accordance with various embodiments, the ion beam 110 may be directed to the substrate in multiple operations, where an operation of exposing the ion beam to substrate 100 may be referred to herein as an ion exposure. As suggested in FIG. 1D, in some embodiments, after a first ion exposure, a rotation may be performed by rotating the substrate 100 about the perpendicular 114 (Z-axis) with respect to the ion beam 110, from a first rotational position to a second rotational position, to a third rotational position, and so forth. In the context of the present embodiments an "exposure cycle" may constitute a combination of an ion exposure at a given substrate and a rotation of the substrate 100 about the perpendicular 114 from a first rotational position to a second rotational position.

In the above manner, the so-called twist angle (φ) of the ion beam 110 may be varied between exposure cycles, where the twist angle refers to the angle between the trajectory of ion beam 110 and a given direction in the substrate 100 along the X-Y plane. Thus, the twist angle between the ion beam 110 and the substrate 100 may vary when either the substrate 110 is rotated about the Z-axis while the trajectory of ion beam 110 maintains a fixed orientation with respect to the X-Y plane. Alternatively, the twist angle may vary when the trajectory of ion beam 110 is rotated about the Z-axis while the substrate 110 is not rotated about the Z-axis. For example, after a first ion exposure, the substrate 100 may be rotated through a designed twist angle to a second rotational position. The ion beam 110 may subsequently be directed to the exposed surface of the layer in an additional ion exposure along the first ion trajectory when the substrate is disposed in the second rotational position. In FIG. 1D, the ion beam 110 is shown in four ion exposures, as four separate arrows directed along four different twist angles, where the twist angles may be equally spaced, such as 90 degrees. While the ion beam 110 is shown in different twist orientations, in various embodiments, the ion beam 110 may remain at a fixed absolute rotational orientation between exposures cycles, while the substrate 100 is rotated about the Z-axis. The embodiments are not limited in this context. Moreover, the value of the non-zero angle of incidence (θ) may be maintained at the same value between ion exposures. The embodiments are not limited in this context.

In various non-limiting embodiments, the value of the non-zero angle of incidence may lie between 10 degrees and 75 degrees, and in particular embodiments may lie between 15 degrees and 45 degrees. The value of the non-zero angle of incidence may be arranged according to the type of material of the layer so as impact different facets of a polycrystalline layer to not increase surface roughness. As such, the ion beam 110 impacts the surface 109 of layer 106 in a manner differently from the manner of impact provided by an ion beam directed along the perpendicular 114. The present inventors have discovered combinations of ion exposures tending to not increase the surface roughness of polycrystalline layers being etched by an ion beam, in comparison to known processing techniques where ions may be directed along the perpendicular 114 to etch the layer 106. For example, while known approaches directing ions along the perpendicular 114 may uniformly etch amorphous materials, the surface of polycrystalline layers such as tungsten tends to roughen as sputter-etching of the layer takes place. While not limited to a particular theory, a physical mechanism responsible for this roughening effect imparted by sputter etching tungsten may be related to the significantly different sputter yield for different facets of the W crystallites making up a polycrystalline layer.

In various embodiments, as generally depicted in FIG. 1A to FIG. 1D, the ion beam 110 may be directed in N different exposure cycles to the substrate 100 to remove material of the layer 106, while also generating an acceptably smooth surface, surface 109, after processing is complete, as shown in FIG. 1C. While four exposure cycles are suggested in FIG. 1D, in some embodiments, N may equal 6 or 8, or a greater value, such as 16. In particular embodiments, the substrate may be disposed at N different rotational positions between the N different exposure cycles, where the N different rotational positions are equally spaced among one another. By the appropriate choice of the number of exposure cycles, where the twist angle is varied between exposure cycles, ions of the ion beam 110 may tend to at least maintain the roughness and not increase the roughness of surfaces or faces of individual crystallites presented by the overall surface, surface 109. In this manner, when etching is completed as shown in FIG. 1C, the surface roughness may be maintained at a target level. In particular, by providing the ion beam 110 at a non-zero angle of incidence (θ) with respect to the perpendicular 114, when the substrate 100 is rotated about the perpendicular 114 through the different twist angles, the different surfaces (facets) of a crystallite may be exposed to the ion beam 110 at different relative trajectories. The exposure to the ion beam at different relative trajectories may generate etching of surfaces at different relative trajectories tending to cancel out the etchrate dependence of given facets. As a result, the given smoothness (or roughness) of a polycrystalline layer may be maintained, so the final surface of the layer 106 at FIG. 1C is not rougher than the initial surface of layer 106 shown in FIG. 1A.

Figure 1F:
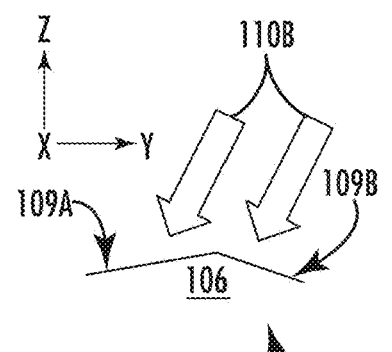

Details of this phenomenon are shown in FIG. 1E and FIG. 1F, where the ion beam 110 is depicted in two different ion exposures. In particular, in FIG. 1E, the substrate 100 is disposed at a first rotational position, and the ion beam 110 is shown as ion beam 110A. As shown in FIG. 1E, depicting a close-up of the surface 109, the ion beam 110A may impact a surface 109A at a first relative orientation and may impact a surface 109B at a second relative orientation. In FIG. 1F the substrate 100 is disposed at a second rotational position by rotating the substrate about the Z-axis with respect to the ion beam 110 through a given twist angle, such as 180 degrees. For this reason, the ion beam 110, shown as ion beam 110B for clarity, is incident on the surfaces 109A and 109B at different orientations than those orientations of ion beam 110A. The impacting of different surfaces at different angles in different ion exposures may accordingly reduce the tendency of surface roughness to develop in response to facet-dependent sputter yield phenomena. In particular, by etching the layer 106 when the ion beam 110A is oriented at a plurality of different twist angles, exposing a given crystalline facet in layer 106 for a prolonged time to the same at the same angle is avoided.

In accordance with some embodiments, the ion beam 110 may be provided as a ribbon beam having an elongated cross-section in a plane perpendicular to the trajectory of the ion beam 110. For example, the ion beam 110 may be elongated along the X-axis having a relatively longer dimension than the dimension of the ion beam 110 along the Y-axis. In some instances, the ion beam 110 may extend for 10 cm, 20 cm, 30 cm, 40 cm, or more, along the X-axis, while extending for 1 mm, 3 mm, 10 mm, or generally less than 50 mm along the Y-axis. The embodiments are not limited in this context. A ratio of the width along the X-axis to length along the Y-axis may be greater than 3, greater than 5, or greater than 10 in some examples. Providing a wide ion beam having a given width along the X-axis may allow the ion beam 110 to simultaneously impact an entire slice-shaped region of a substrate across the width of a substrate along the X-axis when the substrate width is less than or equal to the width of the ion beam 110. For example, if the width of substrate 100 is 200 mm along the X-axis, the ion beam 110 may be sized so as to strike a 20 mm long region of the substrate 100 across a width of 200 mm. Moreover, by scanning the substrate 100 with respect to the ion beam 110 along the Y-axis for a distance corresponding approximately to the length of the substrate 100 along the Y-axis, the entirety of substrate 100 may be exposed to the ion beam 110.

In further embodiments of the disclosure, in a given ion exposure, a pair of ion beams may be directed to a substrate at the same time. Said differently, a given ion exposure may comprise directing a first ion beam to an exposed surface of a layer along a first ion trajectory as described above, while concurrently directing a second ion beam to the exposed surface of the layer along a second ion trajectory. In particular, the second ion trajectory may have a second non-zero angle of incidence with respect to the perpendicular different from the first non-zero angle of incidence.

Figure 2A:
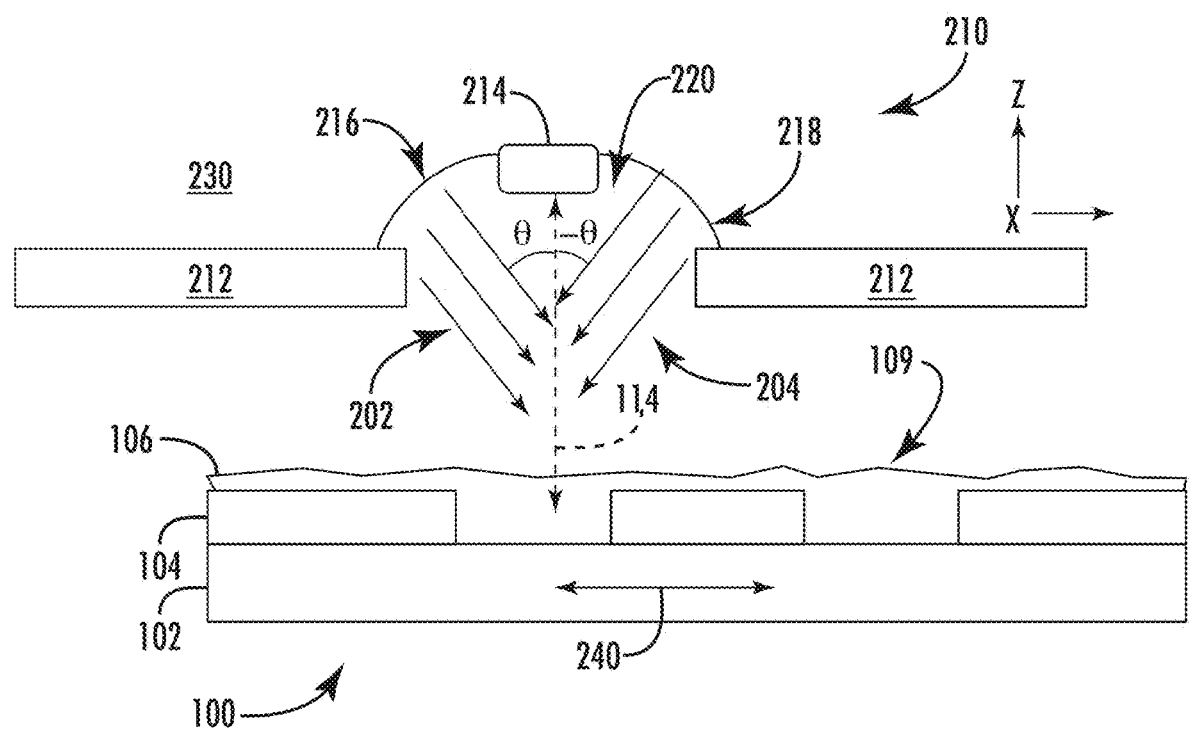
FIG. 2A shows a side cross-sectional view of an exemplary operation for processing a polycrystalline layer, according to further embodiments of the disclosure.

Turning now to FIG. 2A, there is a side cross-sectional view of an exemplary operation for processing a polycrystalline layer, according to further embodiments of the disclosure. In FIG. 2A, the substrate 100 is provided as generally described above, including the substrate features 104. As further shown in FIG. 2A an ion beam 202 is directed to the substrate 100 along a non-zero angle of incidence with respect to perpendicular 114, shown as θ, while an ion beam 204 is concurrently directed to the substrate 100 along a second non-zero angle of incidence with respect to perpendicular 114, shown as −θ. In some embodiments the absolute value of θ and −θ may be the same, such as +30 degrees and −30 degrees. The embodiments are not limited in this context.

FIG. 2A depicts certain portions of a processing apparatus for generating the ion beam 202 and ion beam 204, according to various embodiments. In particular, an extraction assembly 210 is shown, where the extraction assembly 210 may be implemented in a known-type of plasma apparatus generating a plasma 230 in a plasma chamber. The extraction apparatus 210 may function to extract the ion beam 202 and ion beam 204 from the plasma 230, and to direct the ion beams to the substrate 100, when a suitable voltage is applied between the plasma 230 and substrate 100. The plasma 230 may be generated by any suitable known means. According to some embodiments, the ion beam 202 and ion beam 204 may be ribbon beams, elongated along the X-axis. As further shown in FIG. 2A the extraction assembly includes an extraction plate 212 and a beam blocker 214. The extraction plate 212 includes an aperture 220, where the beam blocker 214 may be disposed above the plane of the aperture 220. In this manner the beam blocker 214, and edges of the extraction plate 212 defining the aperture 220 may together generate a plasma meniscus 216 on one side and a plasma meniscus 218 on an opposite side of the beam blocker 214 as shown. These plasma menisci may be oriented in a manner to generate the ion beam 202 and ion beam 204, including the non-zero angle of incidence for the respective ion beams.

In various embodiments, an ion beam or a pair of ion beams, such as ion beam 202 and ion beam 204, may have the shape of a ribbon ion beam having a cross-section defined by a long axis. At the same time, the substrate 100 may be scanned during an ion exposure along a scan direction lying perpendicular to the long axis of a ribbon beam.

Figure 2B:
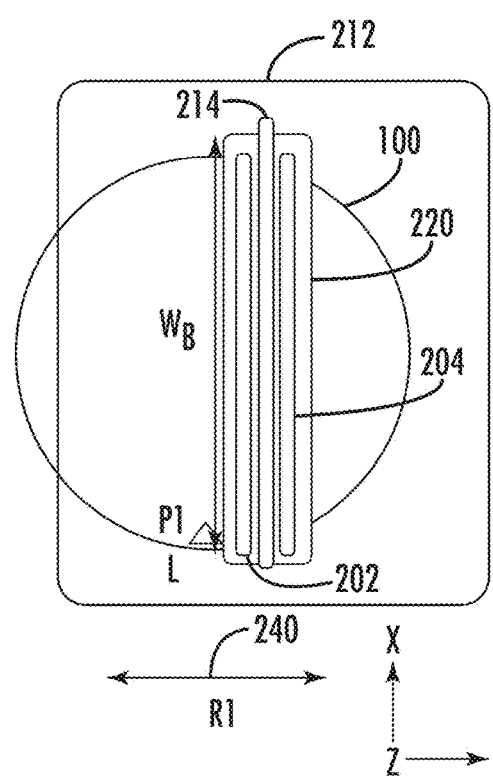
FIG. 2B shows a top plan view of one variant of the exemplary operation of FIG. 2A.

Turning now to FIG. 2B there is shown a top plan view of one variant of the exemplary operation of FIG. 2A. In this example, the substrate 100 is a circular substrate, such as a semiconductor wafer, and the ion beam 202 and ion beam 204 are provided as ribbon beams extending to a beam width along the X-axis. The beam width $W_B$ is adequate to expose an entire width of the substrate 100, even at the widest part along the X-axis.

As also indicated in FIG. 2B, the substrate 100 may be scanned in the scan direction 140, where the scan direction lies in the X-Y plane, such as along the Y-axis. Notably the scan direction 140 may represent the scanning of substrate 100 in two opposing (180 degrees) directions along the Y-axis, or just a scan toward the left or a scan toward the right. As shown in FIG. 2B, the long axis of ion beam 202 and ion beam 204 extends along the X-axis, perpendicularly to the scan direction 140. Accordingly, an entirety of the substrate 100 may be exposed to the ion beam 202 and ion beam 204 when scanning of the substrate 100 takes place along a scan direction 140 during an ion exposure to ion beam 202 and ion beam 204.

As also shown in FIG. 2B, the ion exposure of substrate 100 to the ion beam 202 and ion beam 204 may take place when the substrate 100 is disposed at a first rotational position as indicated by the position P1 on substrate 100 being located under the location L on the extraction plate 212. For example, the position P1 may correspond to the position of a notch on a wafer. In accordance with various embodiments, a plurality of exposure cycles may be performed to etch the layer 106, where the substrate 100 may be rotated through a plurality of different rotational positions, as noted.

Figure 2C:
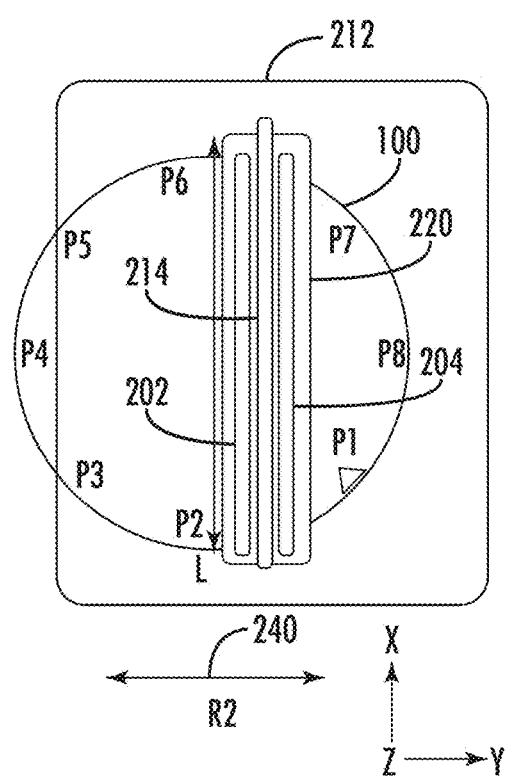
FIG. 2C shows a top plan view of another instance of an operation for processing the layer of FIG. 2A.

Turning now to FIG. 2C there is shown a top plan view of another instance of an operation for processing the layer 106. The general features of processing the substrate 106 may be as described above with respect to FIG. 2A and FIG. 2B. In the instance depicted in FIG. 2C a difference lies in the rotational position of the substrate 100. In this instance, while the substrate is exposed to the ion beam 202 and ion beam 204, the substrate is disposed at a second rotational position where the position P2 on substrate 100 is located under the location L on the extraction plate 212. The position P2 may represent a position lying on a radius of substrate 100 rotated 45 degrees with respect to the radius intercepting the position P1. Accordingly, the substrate 100 has been rotated through a twist angle of 45 degrees with respect to the rotational position of FIG. 2B. Processing of the substrate 100 in this second rotational position may proceed similarly to processing in the rotational position of FIG. 2B, where the substrate 100 is again scanned along the scan direction 140 to expose an entirety of substrate 100 to the ion beam 202 and ion beam 204.

In accordance one particular embodiment, the processes shown in FIG. 2B and FIG. 2C may be extended to 8 exposure cycles, where the substrate is disposed at 8 different rotational positions, as indicated by P1, P2, P3, P4, P5, P6, P7, and P8. The 8 different rotational positions may be evenly spaced among one another in certain variants, such as spaced at rotational increments of 45 degrees. In some embodiments, the substrate 100 may be rotated in consecutive exposure cycles between adjacent rotational positions, such as from P1 to P2 to P3, and so forth. In other embodiments, in consecutive exposure cycles, other rotational sequences may be performed, such as P1 to P5 to P2 to P6 to P3 to P7 to P4 to P8. The use of eight different rotational positions may be appropriate to smoothen a given polycrystalline material, such as tungsten. The number of rotational positions employed to planarize a polycrystalline layer may vary according to material. For example, while tungsten presents a body-centered cubic space group, presenting a certain characteristic faceting, a face centered cubic material such as copper may be characterized by different faceting. Accordingly, the face centered cubic material may be better treated by an ion beam directed to the polycrystalline layer when the substrate is rotated through a different number of rotational positions. Additionally, the degree of preferred crystallographic orientation of a metal layer and the size of crystal grains may affect the shape of crystallite surfaces at the layer surface, and may therefore affect the ideal number of rotational positions to be employed.

The embodiments of FIGS. 2A-2C provide an advantage of directing two ion beams simultaneously to a substrate at two different angles in a given ion exposure. The embodiments of FIGS. 1A-1F with one ion beam provide an advantage of more flexibility in the range of distances between a substrate and extraction plate along the Z-axis where processing the substrate is effective. The embodiments of FIGS. 1A-1F provide the additional advantage of easier tunability of just one ion beam.

Figure 3A:
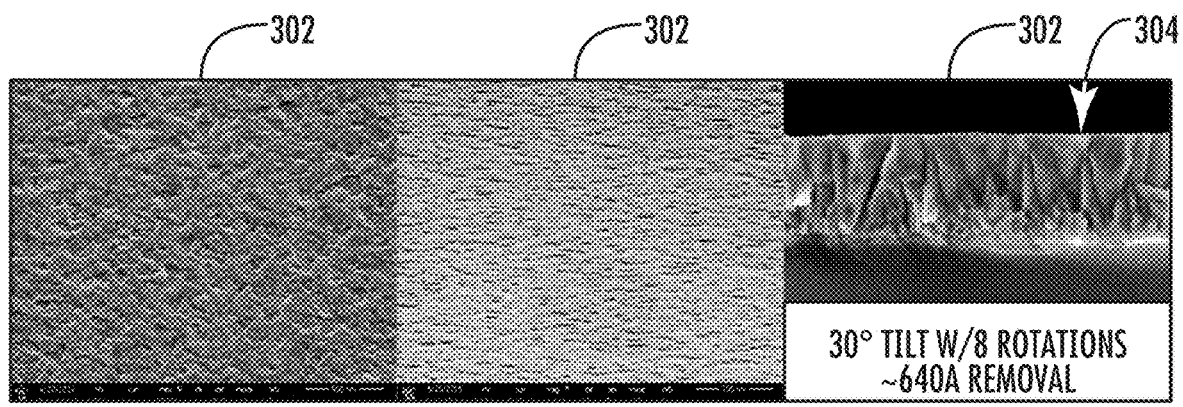
FIG. 3A shows a composite view of the results of etch removal of a tungsten layer, according to an exemplary embodiment of the disclosure.

Depending upon the initial roughness of the layer 106, the crystal structure of the material of layer 106, the thickness of material to be removed, among other factors, the number of exposure cycles may be adjusted. For example, for etching of tungsten layers, the present inventors have observed where 8 exposure cycles provide excellent results for etching from a tungsten deposit an average thickness on the order of 64 nm. Turning now to FIG. 3A there is shown a composite view of the results of etch removal of 64 nm of tungsten from a tungsten layer, according to an exemplary embodiment of the disclosure. The left micrograph shows a top plan view of a processed layer 302, the middle micrograph shows a tilted top view, while the right micrograph shows a side cross-sectional view. In particular, the processed layer 302 shows a tungsten layer after etching using a pair of ion beams directed toward the surface 304 in a series of exposure cycles. The pair of ion beams are ribbon beams and are disposed as generally shown in FIG. 2A, and where the absolute value non-zero angle of incidence equals 30 degrees. In other words, in a given ion exposure, one ion beam is directed at a 30 degree angle of incidence with respect to a perpendicular to the surface 304, while a second ion beam is simultaneously directed at −30 degrees with respect to the perpendicular. Additionally, the processed layer 302 has been exposed to a series of 8 exposure cycles, where the twist angle in the different exposure cycles is 0 degrees, 45 degrees, 90 degrees, 135 degrees, 180 degrees, 225 degrees, 270 degrees, and 315 degrees. As illustrated in the right micrograph of FIG. 3A, the surface 304 is smooth and nearly planar after processing.

Figure 3B:
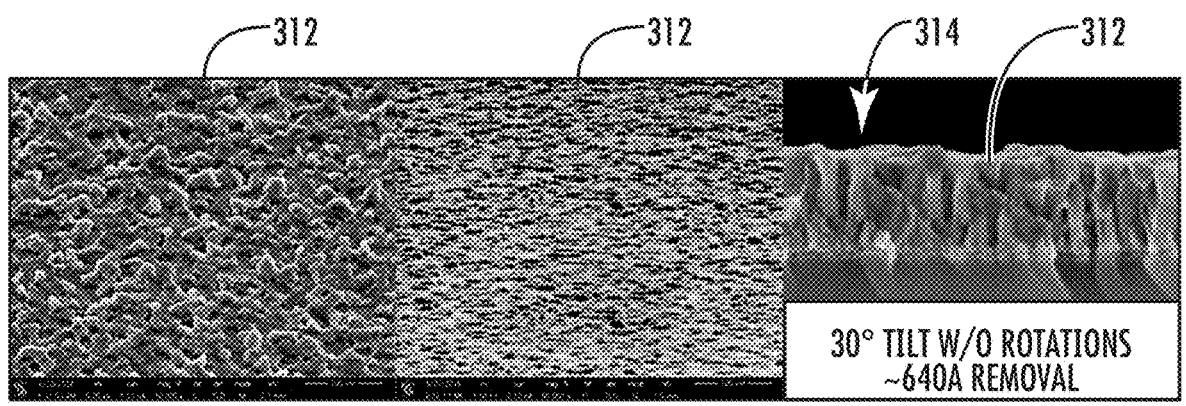
FIG. 3B shows a composite view of the results of etch removal of tungsten from a tungsten layer, when angled ion beams are used to etch tungsten while not rotating the substrate.

Turning now to FIG. 3B there is shown a composite view of the results of etch removal of 64 nm of tungsten from a tungsten layer, when angled ion beams are used to etch tungsten while not rotating the substrate. The left micrograph shows a top plan view of a processed layer 312, the middle micrograph shows a tilted top view, while the right micrograph shows a side cross-sectional view. In particular, the processed layer 312 shows a tungsten layer after etching using a pair of ion beams directed toward the surface 314 in an ion exposure where the pair of ion beams are ribbon beams and are disposed as generally shown in FIG. 2A. Additionally, the absolute value non-zero angle of incidence equals 30 degrees. In other words, in the ion exposure, one ion beam is directed at a 30-degree angle of incidence with respect to a perpendicular to the surface 314, while a second ion beam is simultaneously directed at −30 degrees with respect to the perpendicular. In this case, the processed layer 312 has been exposed to etching ions in just one exposure where the one exposure has a duration sufficient to etch the same amount of material as in FIG. 3A, where eight exposure cycles in total were performed. As illustrated in the right micrograph of FIG. 3B, the surface 314 is rougher than surface 304, characterized by a variation in height at the surface 314 of several tens of nanometers.

In further experiments, an ion beam was directed along a perpendicular to the surface of a layer to etch tungsten while not rotating the substrate. In particular, the ion beam was directed at normal incidence until 64 nm thickness was removed. After the removal of 64 nm, the surface was rougher than surface 304, characterized by a variation in height at the surface of several tens of nanometers.

In accordance with further embodiments of the disclosure, the ion etching techniques as disclosed hereinabove may be used in conjunction with other processing techniques to provide novel approaches to planarization for polycrystalline layers. Turning now to FIG. 4A, there is shown an initial tungsten layer, shown as layer 402, as deposited to a thickness of 400 nm. The top micrograph is a cross-sectional micrograph, while the bottom micrograph provides a tilted top view of the surface 404. The surface 404 exhibits a large degree of roughness where the height varies on the order of 50 nm to 100 nm. Turning now to FIG. 4B, there is shown the layer 402, after processing by chemical-mechanical polishing (CMP) according to a known recipe, in order to remove 300 nm of the layer 402. The top micrograph again is a cross-sectional micrograph, while the bottom micrograph provides a tilted top view of the surface 404. The surface 404 now is smoother, more planar, exhibiting a platelet structure where height variation is much less on the surface 404, consistent with the results of known CMP processing.

Subsequently, the effect of etching a final 250 nm using ion beams directed to the surface 204 using was investigated. As shown in FIG. 4C, the layer 402 was subjected to ion etching using an ion beam directed at a normal incidence to the surface 404, to remove a further 250 nm of the layer 402 in order to correct the CMP-generated across-wafer non-uniformity. In this example, at the micrometer scale, the surface 404A has become much rougher than the surface 404 immediately after CMP, as shown in FIG. 4B. Notably, after etching 250 nm of layer 402, a layer thickness of 50 nm to 70 nm is left for the resulting layer, processed layer 402A, while the height of surface 404A varies by up to 20 nm to 30 nm, indicating a very rough surface. Accordingly, the use of an ion beam of just one orientation to sputter etch material from layer 402, and where the ion beam was directed perpendicularly to the surface 404, was observed to roughness, where the variation is surface height may be unacceptably large when an average target thickness of the processed layer 402A is reached.

After the scenario of FIG. 4B, a series of exposure cycles may be performed using ion beams oriented at a non-zero angle of incidence with respect to the normal to surface 404. In this series of exposure cycles the substrate supporting the layer 404 is rotated through a series of twist angles in successive exposure cycles, with the resulting structure is shown in FIG. 4D. Notably, after etching the same amount of 250 nm from the layer 402 in FIG. 4B, a layer thickness of approximately 60 nm is left for the resulting processed layer 402B, while the height of surface 404B varies by just a few nm, indicating a much smoother surface. Accordingly, the use of multiple exposure cycles according to the present embodiments to perform a final etch of a tungsten layer results in a much smoother surface of the final processed layer.

The processing route outlined by the embodiment of the disclosure including the progression of operations from FIG. 4A, FIG. 4B, and FIG. 4D provides various advantages over known planarization techniques for polycrystalline layers in particular. In accordance with some embodiments, the operations generally depicted in FIGS. 1A-1F and 2A-2C may be modified in a manner to provide a novel technique for planarizing a polycrystalline layer. In particular, this novel planarizing technique may be usefully employed in a planarizing recipe involving an "ion beam last" operation. For example, instead of planarizing a metal layer using a "CMP last" process, where CMP is employed to generate the structure of FIG. 1C, CMP may be employed to initially remove material and polish a rough metal layers shown in FIG. 4B, while angled ion beams are provided in accordance with FIGS. 2A-2C subsequently. The angled ion beams may be used to planarize a substrate down to the surface of underlying structures, as shown in FIG. 1C.

While CMP may be useful to remove a portion of a metal layer, such as the top 50% or more, CMP is known to generate dishing, pattern loading, and other long-range non-uniformities, where the thickness of a layer after CMP varies over macroscopic distances, such as millimeters or centimeters, along the surface of a substrate. This non-uniformity may often be manifested as a thickness distribution along the surface of a substrate resembling a dish, a ring, or other non-uniformity over a millimeter or centimeter length scale.

In some embodiments, the exposure cycles described above may be applied in a manner to suppress surface roughness of a polycrystalline layer on a micro length-scale, such as micrometer distances or less, while also removing macro thickness non-uniformity across a substrate in longer distances such as millimeters or centimeters. In particular, consistent with the experimental results of FIGS. 4A-4D, before the treatment with the ion beams 110, a CMP process may be performed to remove a portion of a layer, such as layer 106. Subsequently, a two dimensional thickness map may be measured over the surface of the substrate 100, using any known technique such as 4-point probe, ellipsometer, and reflectometer, where the thickness map shows the thickness of layer 106 as a function of position on the surface of the substrate 100. This thickness map information may exhibit macro non-uniformities in layer thickness over a millimeter or centimeter length scale, for example. The thickness map information may be provided to a controller coupled to scan and rotate the substrate 100. In order to remove the macro-nonuniformities, the substrate 100 may be scanned along a direction, such as direction 240, according to a scan profile or duty cycle profile, where the wafer scan rate or the duty cycle of the ion extraction voltage is varied during the scan according to a recipe given by the scan profile of duty cycle profile. The "duty cycle" of ion extraction voltage refers to the circumstance where an ion beam is provided as a pulsed ion beam, where the duty cycle is denoted by the portion of a pulse period where the extraction voltage (e.g. 200 V to 10 kV) is applied between substrate and plasma, so as to extract an ion beam. For example, a 50% duty cycle may denote extraction voltage being applied for half the duration of a pulse period, while the extraction voltage is OFF in the other half, resulting in an ion beam being directed to a substrate for just 50% of the time of a given pulse period. In various embodiments, the pulse rate (inverse of the pulse period) may range between 2000 Hz and 40,000 Hz. The duty cycle may be varied by 0% to 90% according to some embodiments. The embodiments are not limited in this context. Said differently, the extraction voltage duty cycle corresponds to an ion beam duty cycle for a pulsed ion beam, where the ion beam duty cycle is the same as the extraction voltage duty cycle. Thus, the ion beam duty cycle may range between 0% and 90% in various embodiments, where the ion beam duty cycle varies between different scan segments of a scan, resulting in differing amounts of ion current being delivered to different portions of a substrate during the scan. In various embodiments, the scan rate may vary between 10 mm/s and 200 mm/s. The embodiments are not limited in this context.

According to various embodiments, the scan rate or duty cycle of extraction voltage may be varied between a first scan segment and a second scan segment during the scan, a third scan rate or duty cycle in a third scan segment, a fourth scan rate or duty cycle in a fourth scan segment, and so forth. In this manner, for a given scan, different slices of the surface of substrate 100, corresponding to different scan segments where the extraction voltage duty cycle or scan rate varies between scan segments, may receive different ion doses. These different slices may represent the shape of a ribbon beam, where the long axis is orthogonal to the scan direction 240. Accordingly, the different slices may have a resulting difference in the amount of material of layer 106 removed by the ion beams 110 (or alternatively, the ion beam 202 and ion beam 204), as a function of position above the substrate 100 along the scan direction.

Additionally, the scan profile or duty cycle profile may be varied as the substrate 100 is rotated through a series of different rotational positions, as discussed above with respect to FIGS. 2B-2C. The combination of using a plurality of scan profiles or duty cycle profiles, where a given scan or duty cycle profile may vary scan speed or extraction duty cycle over a given scan, and where the plurality of scan or duty cycle profiles are applied in a series of exposure cycles where the substrate 100 is rotated through a twist angle between exposure cycles, allows the ion beams 110 to apply a non-uniform ion dose to etch the layer 106 in a non-uniform manner as a function of position in the X-Y plane on the substrate 100. This non-uniform etching of the layer 106 may be matched to the initial thickness non-uniformity present before the substrate is treated with the ion beams 110, such as the non-uniformity of a metal layer thickness generated after CMP processing. This manner of non-uniform treatment of the substrate 100 by non-uniform scanning of a substrate during a scan or through non-uniform ion beam current generated by changing extraction voltage duty cycle during a scan may be referred to herein as selective area processing (SAP). The SAP may be combined with the approaches shown in FIG. 1A to FIG. 2C to remove macro non-uniformity in layer thickness, and to suppress surface roughness of a polycrystalline layer.

An advantage of combining SAP with the angled ion beams for treating a metal layer is in the ability to remove local (nanometer to micrometer) surface roughness of a layer and to remove macro thickness variation in the layer in a unitary process. Because of the use of multiple exposures of angled ion beams directed at multiple twist angles, the surface roughness of a layer, such as layer 106, may be at least maintained and not increased as the layer is etched toward an underlying feature, such as feature 104 shown in FIG. 1B, so the final portion of layer 106 is removed above the feature 104 while not unduly etching the feature 104. Secondly, because macro-thickness non-uniformities are reduced during etching, a given substrate feature located in the center of the substrate 100, such as feature 104, may be exposed at the same time as a corresponding substrate feature located on the outside of the substrate 100 is exposed.

In particular, when combined with a CMP process applied to remove an initial amount of a polycrystalline layer, the treatment using multiple angled ion beams may reduce or eliminate macro-thickness non-uniformity at the wafer scale, while also preserving the micro-smoothness of a layer afforded by the use of CMP.

Figure 5:
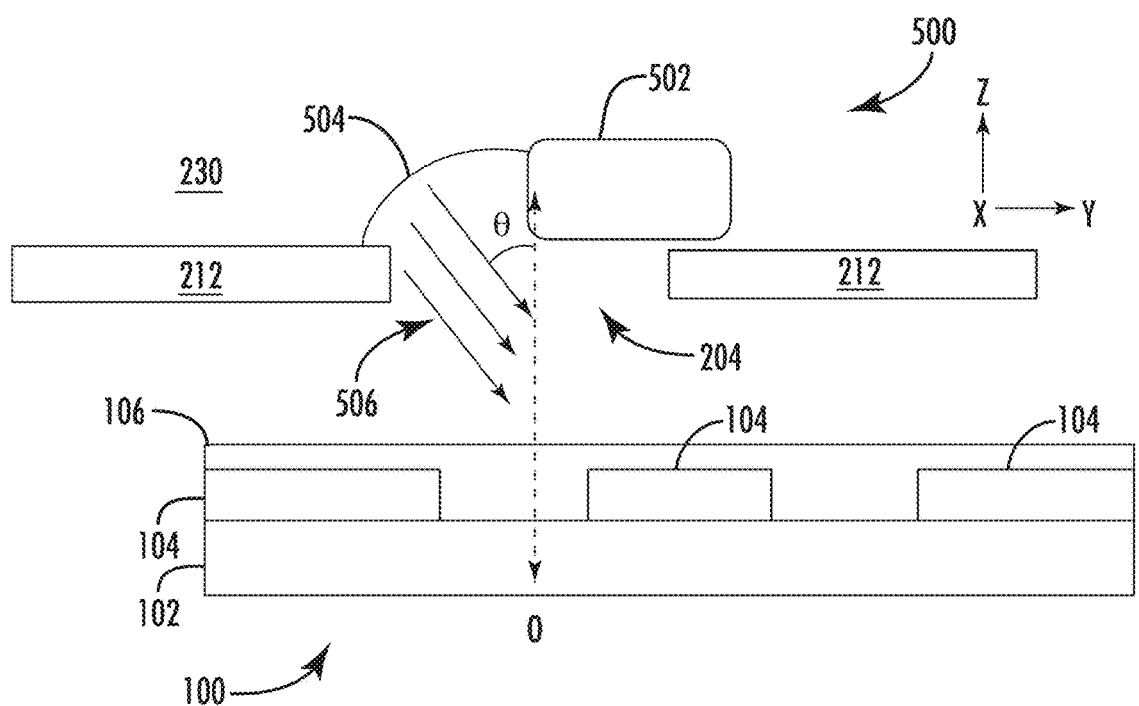
FIG. 5 shows a side cross-sectional view of an exemplary operation for processing a polycrystalline layer, according to further embodiments of the disclosure.

Turning now to FIG. 5, there is a side cross-sectional view of an exemplary operation for processing a polycrystalline layer, according to further embodiments of the disclosure. In FIG. 5, the substrate 100 is provided as generally described above, including the substrate features 104. As further shown in FIG. 5, an extraction assembly 500 is provided, where a beam blocker 502 is arranged with respect to aperture 204 so as to generate just one meniscus, shown as meniscus 504. Accordingly, just one ion beam, shown as ion beam 506, is generated from plasma 230, where the ion beam 506 is directed to the substrate 100 along a non-zero angle of incidence with respect to perpendicular 114, shown as θ. Accordingly, the extraction aperture of FIG. 5 may be appropriate to generate processing of the substrate 100 as described above with respect to FIGS. 1A-1F.

Figure 6A:
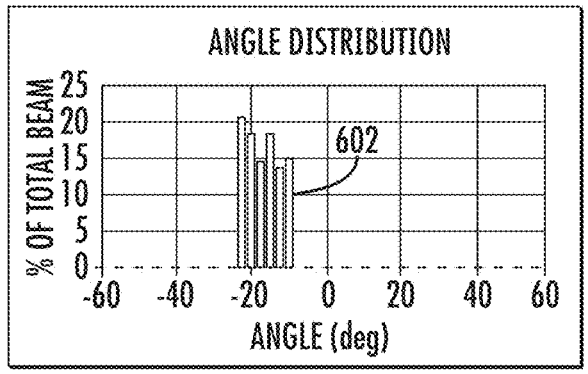
FIG. 6A provides exemplary data illustrating an ion angular distribution for an ion beam in accordance with the present embodiments.
Figure 6B:
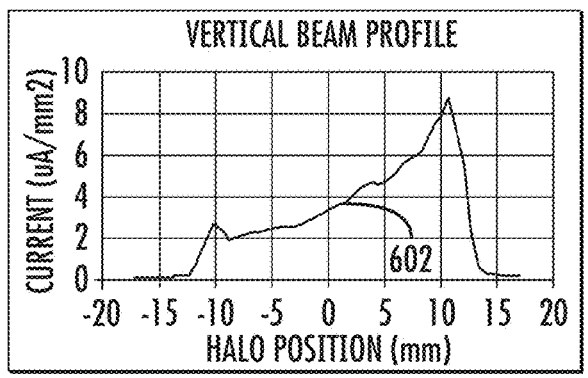
FIG. 6B is a graph providing exemplary data illustrating the current distribution for the ion beam of FIG. 6A.
Figure 6B:
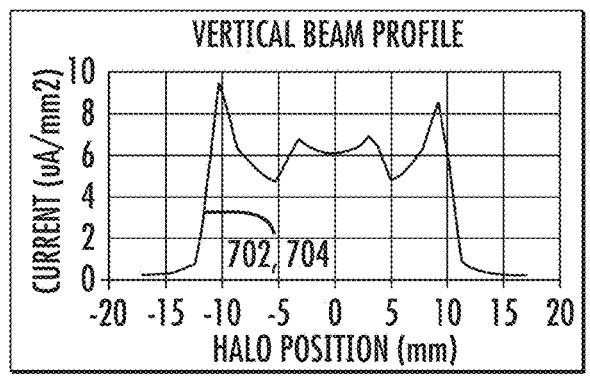

While the aforementioned embodiments disclose an ion beam where the ion trajectory is characterized by a single angle of incidence, such as 30 degrees, in various embodiments an angled ion beam may be directed to a substrate for etching, where the ions forming the ion beam span a range of angles of incidence. FIG. 6A is a graph providing exemplary data illustrating an ion angular distribution for an ion beam suitable for treating a polycrystalline layer in accordance with the present embodiments. An ion beam 602 is characterized in a histogram by the percentage of ions of the ion beam 602 as a function of angle of incidence with respect to a perpendicular to a substrate. In this example, the ion beam spans a range of angles of incidence between approximately 10 degrees and 22 degrees, with an average angle of incidence of approximately 16 degrees. FIG. 6B is a graph providing exemplary data illustrating the current distribution for the ion beam 602, at approximately the substrate plane. As shown, current is plotted as a function of position along the Y-axis. The zero position may be considered to be a point along a substrate under the center of an aperture, as shown in FIG. 5. As illustrated, most of the beam current for ion beam 602 strikes to the right (positive) of zero.

Figure 7A:
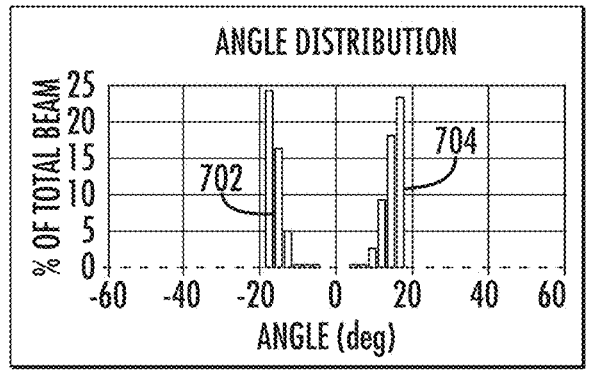
FIG. 7A is a graph providing exemplary data illustrating another ion angular distribution for a pair of ion beams in accordance with various embodiments of the disclosure.

FIG. 7A is a graph providing exemplary data illustrating another ion angular distribution for an ion beam 702 and ion beam 704, again suitable for treating a polycrystalline layer in accordance with various embodiments of the disclosure. The ion beam 702 and ion beam 704 may be generated by the extraction assembly 210, or similar apparatus, where the two ion beams are provided to a substrate at the same time. The ion beam 702 and ion beam 704 are also characterized in a histogram by the percentage of ions as a function of angle of incidence with respect to a perpendicular to a substrate. In this example, the ion beam 702 spans a range of angles of incidence between approximately −18 degrees and −6 degrees, with a peak (mode) at −18 degrees. The distribution of angles of incidence is narrow, where 80% of ions of the ion beam 702 have trajectories of −18 degrees or −16 degrees. In this example, the ion beam 704 spans a range of angles of incidence between approximately 18 degrees and 6 degrees, with a peak (mode) at 18 degrees. The distribution of angles of incidence is narrow, where 80% of ions of the ion beam 704 have trajectories of 18 degrees or 16 degrees. FIG. 7B is a graph providing exemplary data illustrating the current distribution for the combination of ion beam 702 and ion beam 704, at approximately the substrate plane. Beam current is plotted as a function of position along the Y-axis, as described with respect to FIG. 6B. FIG. 7B shows the current from ion beam 702 and ion beam 704 overlapping in space, while the beam current shows a symmetrical and bimodal distribution, peaked at −10 mm and +10 mm.

Figures 8A, 8B:
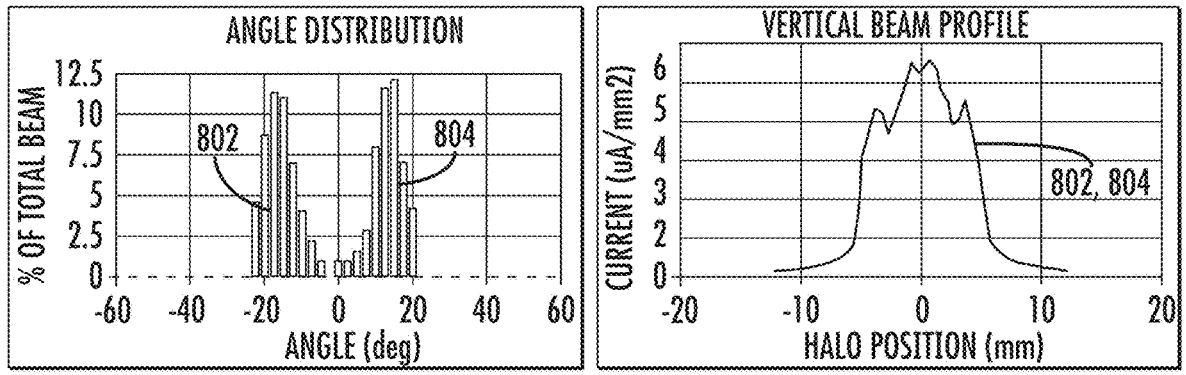
FIG. 8A is a graph providing exemplary data illustrating another ion angular distribution for a pair of ion beams, consistent with various embodiments of the disclosure.
FIG. 8B is a graph illustrating the current distribution for the pair of ion beams corresponding to the data of FIG. 8A.

In additional embodiments, an extraction assembly, such as extraction assembly 210, may be configured and ion beams tuned in a manner where two ion beams merge to form an ion beam at a substrate position. FIG. 8A is a graph providing exemplary data illustrating another ion angular distribution for an ion beam 802 and ion beam 804, again suitable for treating a polycrystalline layer in accordance with various embodiments of the disclosure. The ion beam 802 and ion beam 804 may be generated by the extraction assembly 210, or similar apparatus, where the two ion beams are provided to a substrate at the same time. The ion beam 802 and ion beam 804 are also characterized in a histogram by the percentage of ions as a function of angle of incidence with respect to a perpendicular to a substrate. In this example, the ion beam 802 spans a range of angles of incidence between approximately −22 degrees and 0 degrees, with a peak (mode) at −15 degrees, while the ion beam 804 spans a range of angles of incidence between approximately 22 degrees and 0 degrees, with a peak (mode) at 15 degrees. FIG. 8B is a graph providing exemplary data illustrating the current distribution for the combination of ion beam 802 and ion beam 804, at approximately the substrate plane. Beam current is plotted as a function of position along the Y-axis, as described with respect to FIG. 6B. FIG. 8B shows the current from ion beam 802 and ion beam 804 overlapping in space, while the beam current shows a symmetrical distribution about the zero position, similar to a distribution generated by a single ion beam incident at normal incidence. Notably, while in FIG. 8B the distribution of beam current is centered about a zero position at the substrate as in the case of a single ion beam at normal incidence, the ions generating the beam current are primarily incident on the substrate over two narrow ranges of angles centered around −15 degrees and +15 degrees with respect to a perpendicular to the substrate plane. Accordingly, the embodiment of FIG. 8A and FIG. 8B provides a narrow ion beam generating angled ions for improved planarization of a polycrystalline layer.

Figure 9:
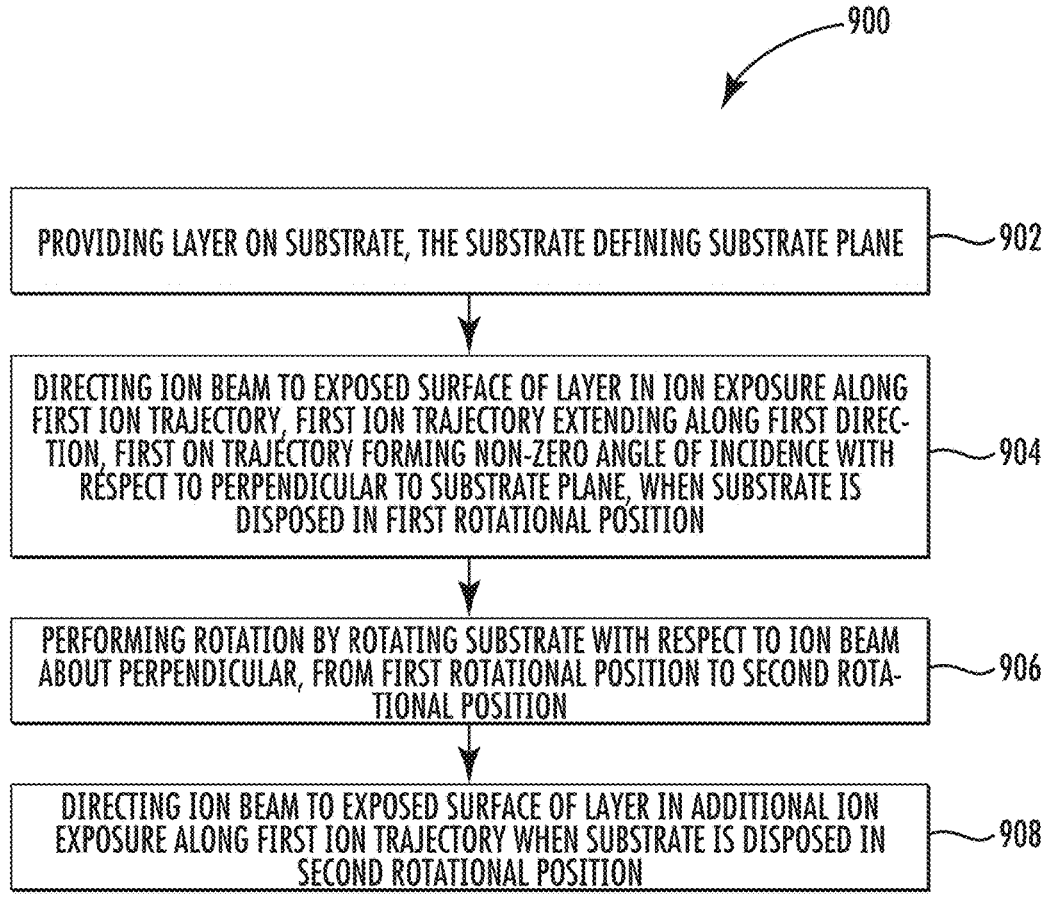
FIG. 9 presents an exemplary process flow according to embodiments of the disclosure.

FIG. 9 presents an exemplary process flow 900 according to embodiments of the disclosure. At block 902, a layer is provided on a substrate, where the substrate defines a substrate plane. The layer may be a polycrystalline metal in some embodiments. In some examples, the substrate may include a feature or features disposed underneath the layer.

At block 904, an ion beam is directed to an exposed surface of the layer in an ion exposure along first ion trajectory when substrate is disposed in first rotational position. The first ion trajectory may extend along a first direction where the first ion trajectory forms a non-zero angle of incidence with respect to a perpendicular to the substrate plane. In some examples the non-zero angle of incidence may be between 10 degrees and 75 degrees.

At block 906 a rotation is performed by rotating the substrate with respect to the ion beam about the perpendicular, from a first rotational position to a second rotational position. At block 908 the ion beam is directed to the exposed surface of the layer in an additional ion exposure along the first ion trajectory when the substrate is disposed in the second rotational position.

The present embodiments provide various advantages over conventional metal planarization approaches. In particular, various embodiments facilitate the use of ion beams to planarize a polycrystalline layer as a last process in the planarization operation, avoiding the need to use chemical mechanical polishing to complete planarization. Various embodiments also provide the advantage of planarizing a metal layer over a macroscopic region, such as across the entirety of a substrate, while not increasing surface roughness on a microscopic level. Another advantage provided by various embodiments compared with known ion beam techniques for etching a layer is the reduced particle creation and improved process stability when using an extraction assembly having a beam blocker disposed in the middle of an aperture. Still another advantage of the present embodiments is improved device yield as well as improvement in process metrologies. For example, the improved layer smoothness generated by the present embodiments removes one variable from a modeled film stack, rendering easier the calculation of layer thickness using know techniques, such as reflectometry. Still another advantage of various embodiments is the etching process can be made non-selective, accordingly avoiding the various surface non-uniformities produced by known CMP processing, such as dishing, erosion, and pattern loading.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of processing a layer, comprising:
providing the layer on a substrate, the substrate defining a substrate plane, the substrate including at least one buried feature disposed below an exposed surface of the layer, and the layer having a first thickness and a first roughness;
etching the layer using an ion exposure to reduce the height of the layer,
wherein the ion exposure comprises directing an ion beam to the exposed surface of the layer when the substrate is disposed in a first rotational position, the ion beam having a first ion trajectory, the first ion trajectory extending along a first direction, wherein the first ion trajectory forms a non-zero angle of incidence with respect to a perpendicular to the substrate plane;
rotating the substrate with respect to the ion beam about the perpendicular from the first rotational position to a second rotational position; and
directing the ion beam to the exposed surface of the layer in an additional ion exposure along the first ion trajectory when the substrate is disposed in the second rotational position, wherein after the ion exposure and the additional ion exposure, the exposed surface of the layer is planar with a top surface of the at least one buried feature.

2. The method of claim 1, wherein the ion exposure and the rotation comprise an exposure cycle, wherein the method comprises N exposure cycles, wherein the substrate is rotated between N different rotational positions, wherein N is at least 4.

3. The method of claim 2, wherein N is at least 8.

4. The method of claim 1, wherein the ion beam is a first ion beam, wherein the non-zero angle of incidence is a first non-zero angle of incidence, the ion exposure comprises directing a second ion beam to the exposed surface of the layer along a second ion trajectory, concurrently with the directing the first ion beam, the second ion trajectory forming a second non-zero angle of incidence with respect to the perpendicular, the second non-zero angle of incidence being different from the first non-zero angle of incidence.

5. The method of claim 1, wherein the ion beam comprises a ribbon ion beam having a cross-section defined by a long axis, the method further comprising performing a scanning of the substrate along a scan direction during the ion exposure, wherein the scan direction is perpendicular to the long axis.

6. The method of claim 5, wherein the scanning comprises scanning the substrate along the scan direction for a plurality of scans.

7. The method of claim 1, wherein the layer comprises a polycrystalline layer, the polycrystalline layer comprising a first material, wherein the substrate comprises the at least one buried feature disposed below a surface of the polycrystalline layer, the at least one buried feature having an upper surface and comprising a second material, different from the first material, and wherein after the additional ion exposure the upper surface of the at least one buried feature is exposed.

8. The method of claim 1, wherein the ion beam comprises inert gas ions.

9. The method of claim 1, wherein the layer comprises tungsten, wherein the non-zero angle of incidence is between 15 degrees and 45 degrees.

10. The method of claim 7, wherein the polycrystalline layer comprises tungsten, and wherein the second material comprises polycrystalline silicon, an oxide, or a nitride.

11. A method of processing a layer disposed on a substrate, comprising:
subjecting the substrate to a first ion exposure, after the layer has been subject to a polishing operation,
wherein before the polishing operation, the layer exhibits a first thickness and a first roughness,
wherein after the polishing operation and before the first ion exposure, the layer exhibits a second thickness, less than the first thickness, and the layer exhibits a second roughness, less than the first roughness,
wherein the first ion exposure comprises directing an ion beam to an exposed surface of the layer when the substrate is disposed in a first rotational position, the ion beam having a first ion trajectory forming a non-zero angle of incidence with respect to a perpendicular to a substrate plane;
scanning, during the first ion exposure, the substrate in a first scan along a scan direction, the scan direction lying in the substrate plane;
performing a rotation by rotating the substrate with respect to the ion beam about the perpendicular from the first rotational position to a second rotational position;
directing the ion beam to the exposed surface of the layer in an additional ion exposure along the first ion trajectory, when the substrate is disposed in the second rotational position; and
scanning, during the additional ion exposure, the substrate in a second scan along the scan direction, wherein after the first ion exposure and the additional ion exposure, the exposed surface of the layer is planar with a top surface of at least one buried feature extending from the substrate.

12. The method of claim 11, wherein the ion beam comprises a ribbon ion beam having a cross-section defined by a long axis, wherein the scan direction is perpendicular to the long axis.

13. The method of claim 12, wherein at least one of the first scan and the second scan comprises a non-uniform scan, the non-uniform scan comprising a first scan segment having a first scan speed and a second scan segment having a second scan speed, different from the first scan speed.

14. The method of claim 12, wherein at least one of the first scan and the second scan comprises a non-uniform scan, the non-uniform scan comprising a first scan segment having a first ion beam duty cycle, and a second scan segment having a second ion beam duty cycle, different from the first ion beam duty cycle.

15. The method of claim 11, wherein the ion exposure and the rotation comprise an exposure cycle, wherein the method comprises N exposure cycles, wherein the substrate is disposed at N different rotational positions, the N different rotational positions being evenly spaced among one another, wherein N is at least 8.

16. The method of claim 11, wherein the ion beam is a first ion beam, the non-zero angle of incidence being a first non-zero angle of incidence, wherein the ion exposure and the additional ion exposure comprise directing the first ion beam concurrently with the directing a second ion beam to the exposed surface of the layer along a second ion trajectory, the second ion trajectory forming a second non-zero angle of incidence with respect to the perpendicular, the second non-zero angle of incidence being different from the first non-zero angle of incidence.

17. A method of processing a metal layer, comprising:
providing a substrate comprising the metal layer and a buried feature, wherein the metal layer is disposed over the buried feature;
subjecting the metal layer to an ion exposure, after the metal layer has been subject to a polishing operation,
wherein before the polishing operation, the metal layer exhibits a first thickness and a first roughness,
wherein after the polishing operation and before the ion exposure, the metal layer exhibits a second thickness, less than the first thickness, and the metal layer exhibits a second roughness, less than the first roughness;
directing an ion beam to an exposed surface of the metal layer in a first ion exposure when the substrate is disposed in a first rotational position, the ion beam having a first ion trajectory forming a non-zero angle of incidence with respect to a perpendicular to a substrate plane;
scanning, during the first ion exposure, the substrate in a first scan along a scan direction, the scan direction lying in the substrate plane;
performing a rotation by rotating the substrate with respect to the ion beam about the perpendicular from the first rotational position to a second rotational position;
directing the ion beam to the exposed surface of the layer in a second ion exposure along the first ion trajectory, when the substrate is disposed in the second rotational position; and
scanning, during the second ion exposure, the substrate in a second scan along the scan direction, wherein after the first ion exposure and the additional ion exposure, the exposed surface of the metal layer is planar with a top surface of the buried feature.

18. The method of claim 17, wherein at least one of the first scan and the second scan comprises a non-uniform scan, the non-uniform scan comprising:
a first scan segment having a first scan speed or a first ion beam duty cycle;
and a second scan segment having a second scan speed or second ion beam duty cycle, the second scan speed being different from the first scan speed, and the second ion beam duty cycle being different from the first ion beam duty cycle.

* * * * *